United States Patent [19]

Rakers et al.

[11] Patent Number: 5,525,920
[45] Date of Patent: Jun. 11, 1996

[54] COMPARATOR CIRCUIT AND METHOD THEREOF

[75] Inventors: Patrick L. Rakers, Schaumburg, Ill.; Douglas A. Garrity, Gilbert, Ariz.

[73] Assignee: Motorola, Inc., Schaumburg, Ill.

[21] Appl. No.: 431,965

[22] Filed: May 1, 1995

[51] Int. Cl.[6] .................................................. H03K 5/22
[52] U.S. Cl. ................................. 327/65; 327/63; 327/71
[58] Field of Search ......................... 327/63–89, 91–96, 327/337, 554; 330/9, 51

[56] References Cited

U.S. PATENT DOCUMENTS

| | | | |
|---|---|---|---|
| 4,523,107 | 6/1985 | Peterson | 327/95 |
| 4,539,551 | 9/1985 | Fujita et al. | 327/89 |
| 4,546,324 | 10/1985 | Bingham et al. | 327/91 |
| 4,710,724 | 12/1987 | Connell et al. | 330/9 |
| 4,803,462 | 2/1989 | Hester et al. | 327/407 |
| 5,302,869 | 4/1994 | Hosotani et al. | 327/75 |
| 5,362,996 | 11/1994 | Lin | 327/72 |

OTHER PUBLICATIONS

"A 10-bit, 20-MS/s, 35-mW Pipeline A/D Converter," by Cho et al., IEEE 1994 Custom Integrated Circuits Conference, pp. 499–502.

Primary Examiner—Toan Tran
Attorney, Agent, or Firm—Robert D. Atkins

[57] ABSTRACT

Comparator circuit (72) samples a differential input signal at switched capacitor circuit (100). The input signal is stored across capacitors (128, 130, 132, 134). Reference voltages are subtracted from the input signal to produce a difference signal. The difference is compared to a mid-supply reference VMID, and an amplified representation of the signal is produced at the output of differential gain stage (136). Latching output stage (138) uses feedback circuits (204, 211 and 202, 208) to process the amplified signal and to produce a rail to rail representation of the amplified signal at the inputs (146, 148) of SR latch (140). The feedback circuit also powers-down the output stage after processing the amplified signal. Buffer circuits (205, 213 and 214, 212) allow a new signal to be processed by capacitor circuit (100) while the previous signal is being stored in the SR latch.

11 Claims, 2 Drawing Sheets

COMPARATOR CIRCUIT AND METHOD THEREOF

CROSS REFERENCE TO RELATED PATENT APPLICATIONS

The present application is related to copending U.S. patent application No. 08/463,818, entitled "RSD ANALOG-TO-DIGITAL CONVERSION CIRCUIT AND METHOD THEREOF", filed Jun. 5, 1995, by Douglas A. Garrity et al and assigned to the same assignee, Motorola, Inc.

BACKGROUND OF THE INVENTION

The present invention relates in general to comparators and, more particularly, to high speed comparators with low static current drain.

In the past, high speed comparators have been used in integrated circuit applications such as analog-to-digital conversion circuits. The comparators are used to compare an input signal to a reference signal. In the past, reference signals have been provided by reference voltage generators that are external to the comparator circuit. The reference signal generators, including respective hard-wired interconnect, consume valuable space in the integrated circuit.

High speed comparators used in analog-to-digital conversion applications are constructed with multiple gain stages to achieve high gain while maintaining adequate comparison speed. The additional gain stages consume valuable silicon real estate and require large current consumption to enhance the speed of the comparator. Latching comparator stages have been implemented to achieve increased gain. However, the latching comparator requires positive feedback to its inputs to achieve the high gain. Therefore, additional circuitry is required to disconnect the inputs of the latching comparator while a comparison decision is being made. Additionally, the latching comparator continues to consume power after the comparison is completed.

Hence, a need exists for a minimum component high speed comparator that consumes minimal current drain and has the capability of self-generating reference signals.

DETAILED DESCRIPTION OF THE PREFERRED EMBODIMENT

Figure 1:
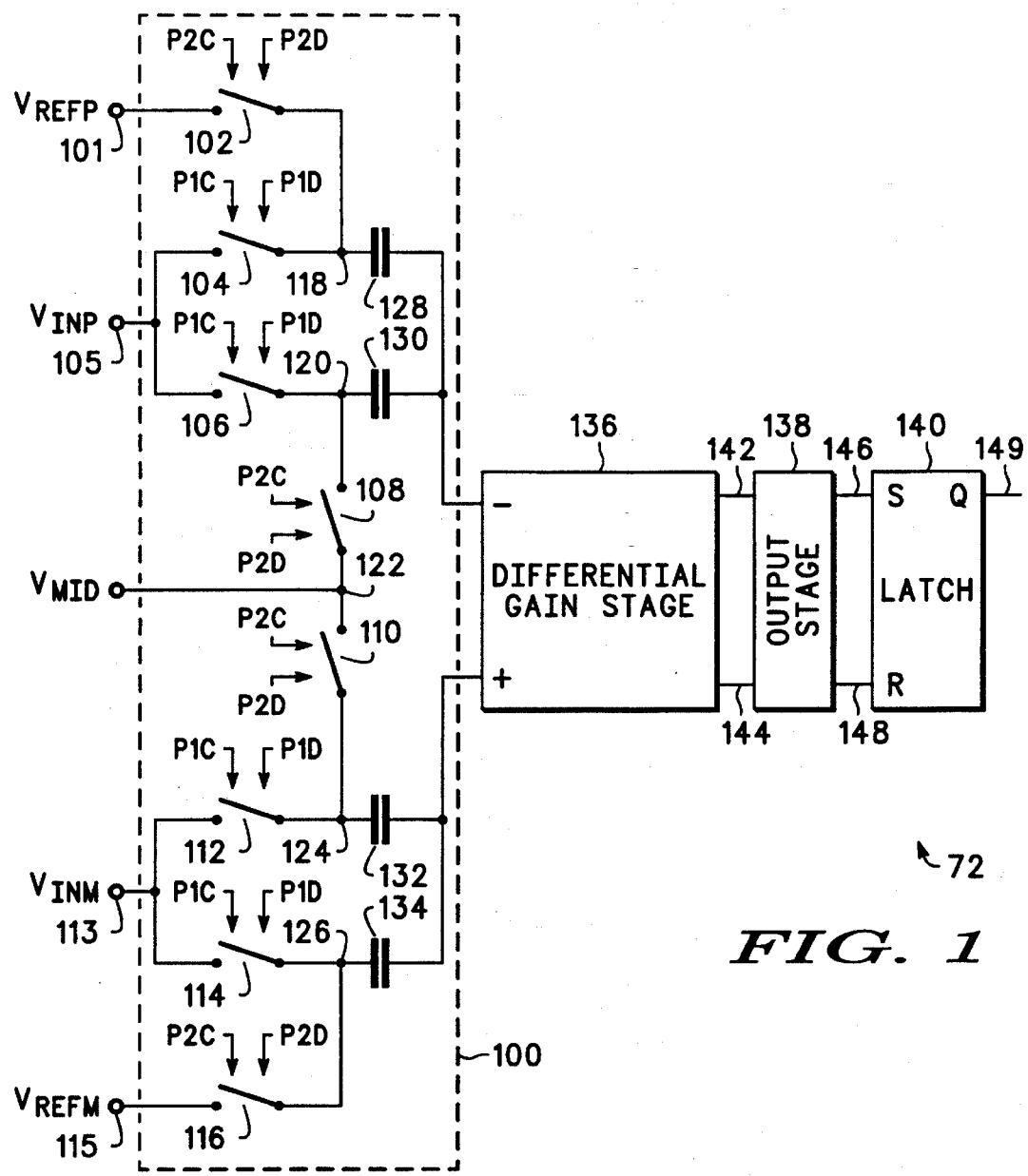
FIG. 1 is a block diagram and schematic illustrating a high speed latching comparator.

Referring to FIG. 1, comparator circuit 72 is shown suitable for manufacturing as an integrated circuit. Comparator circuit 72 includes switched capacitor circuit coupled to receive a differential signal VINP and VINM at nodes 105 and 113, respectively. Switched capacitor circuit 100 is further coupled to receive high VREFP and low VREFM reference signals at nodes 101 and 115, respectively. Mid-supply voltage VMID is applied to node 122 of switched capacitor circuit 100. For the present example, comparator circuit 72 operates at a supply voltage of 2.70 volts. The differential input voltage range is from 0.350 volts to 2.350 volts, VREFP is +2.350 volts, VREFM is 0.350 volts, and VMID is 1.350 volts. The operation of comparator circuit 72 is constrained by the resultant limitations of wafer fabrication processing and physical dimensioning of the integrated circuit. Alternatively, comparator circuit 72 is fabricated as a hybrid circuit or a discrete circuit.

Switched capacitor circuit 100 is coupled across the positive and negative inputs of differential gain stage 136. An embodiment of gain stage 136 is disclosed in U.S. Pat. No. 4,710,724 and is hereby incorporated by reference. The differential output of gain stage 136 is coupled to the input nodes 142 and 144 of comparator output stage 138. The differential output of output stage 138 is coupled to S (SET) and R (RESET) inputs of SR latch 140. The Q-output of SR latch 140 is coupled to node 149. In an alternate embodiment of the present invention, an additional gain stage (not shown) is inserted between differential gain stage 136 and output stage 138 to provide a higher signal output level.

Reference signal VREFP is applied through switch 102 to node 118. Input signal VINP is applied through switches 104 and 106 to nodes 118 and 120, respectively. Capacitor 128 is coupled between the negative input of differential gain stage 136 and node 118 and operates as a charge storage element. Capacitor 130 is coupled between the negative input of differential gain stage 136 and node 120 and operates as a charge storage element. Mid-reference voltage supply VMID is coupled through switch 108 to node 120. Reference signal VREFM is coupled through switch 116 to node 126. Input signal VINM is coupled through switches 112 and 114 to nodes 124 and 126, respectively. Capacitor 132 is coupled between the positive input of differential gain stage 136 and node 124 and operates as a charge storage element. Capacitor 134 is coupled between the positive input of differential gain stage 136 and node 126 and operates as a charge storage element. Mid-reference voltage supply VMID is coupled through switch 110 to node 124.

Switches 102, 104, 106, 108, 110, 112, 114, and 116 are fabricated with n-channel and p-channel transistors (not shown) configured as CMOS transmission gates, with their drains and sources respectively coupled together. Control signal P1C controls the gate electrodes of p-channel transistors of switches 104, 106, 112, and 114. Control signal P1D controls the gate electrodes of n-channel transistors of switches 104, 106, 112, and 114. Control signal P2C controls the gate electrodes of p-channel transistors of switches 102, 108, 110, and 116. Control signal P2D controls the gate electrodes of n-channel transistors of switches 102, 108, 110, and 116.

Figure 2:
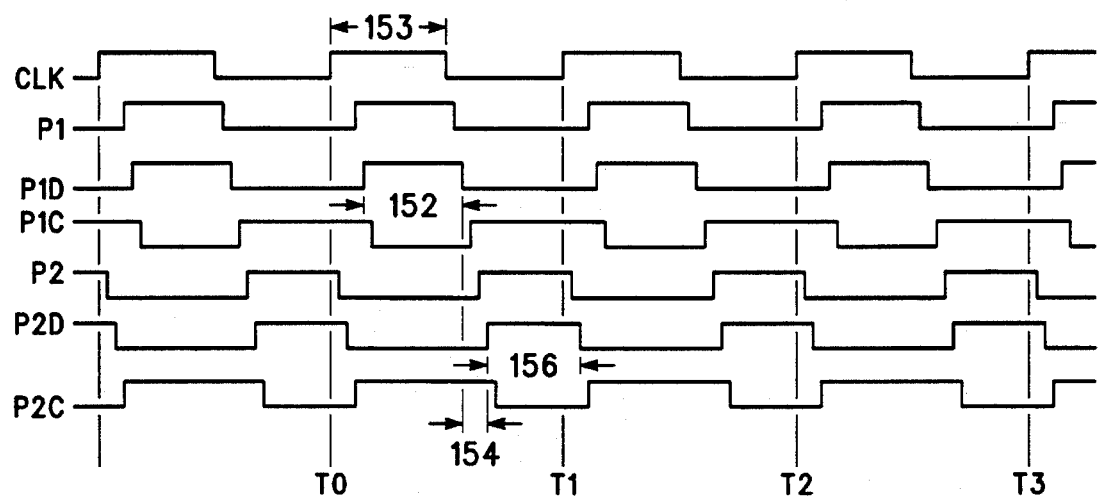
FIG. 2 is a table of control signals illustrating functional timing for the high speed latching comparator of FIG. 1.

Referring to FIG. 2, timing relationship 150 of control signals P1, P1C, P1D, P2, P2C, and P2D is shown. Control signals P1, P1C, P1D, P2, P2C, and P2D are generated from a system master clock CLK using a non-overlapping clock generator (not shown). For example control signal P1C is derived from P1 control signal, and control signal P1D is derived from control signal P1C. Control signal P1D is a delayed replica of control signal P1. Control signal P2C is derived from P2 control signal, and control signal P2D is derived from control signal P2C. Control signal P2D is a delayed replica of control signal P2. The resultant P1, P1C, P1D, P2, P2C, and P2D control signals ensure correct operation of comparator circuit 72. The symbols P1, P1C, and P1D refer to phase ONE operation for the clock generator. The symbols P2, P2C, and P2D refer to phase TWO operation for the clock generator. Control signals P1, P1C, P1D, P2, P2C, and P2D can be generated using alternative logic circuits. In an alternate embodiment of the present invention, switches 102, 104, 106, 108, 110, 112, 114, and 116 are fabricated as single transistors.

Switched capacitor circuit 100 is initialized by storing VREFP minus VMID across capacitors 128 and 130 by closing switches 102 and 108. Likewise, VREFM minus VMID is stored across storage capacitors 132 and 134. Switching circuits 104 and 106 close, and input signal VINP is then sampled across storage element capacitors 128 and 130 switching circuits 112 and 114 close and input signal VINM is sampled across storage element capacitors 132 and 134. The resulting output signal is the differential input signal, VINP minus VINM, minus the quotient of the differential reference signal, VREFP minus VREFM, and a constant, as shown in equation (1). The constant is a function of the ratio of storage elements, e.g., capacitors 130 and 128. The resulting signal is amplified by differential gain stage 136 to provide a comparison signal at input nodes 142 and 144.

Looking in more detail to the operation of switched capacitor circuit 100, just prior to time T0 of FIG. 2, control signal P2C is at a logic ZERO level and P2D is at a logic ONE level causing switches 102 and 108 to close. Control signal P1C is at a logic ONE level and control signal P1D is at a logic ZERO causing switches 104 and 106 to open. The inputs to differential gain stage 136 are shorted together. VREFP minus VMID is thus applied across capacitors 128 and 130. Similarly, switches 116 and 110 are closed, and switches 112 and 114 are open, applying VREFM minus VMID across capacitors 132 and 134. Just after time T0, in FIG. 2, CLK pulse 153 causes a transition of P1C to a logic ZERO and a corresponding P1D transition to a logic ONE, causing switches 104, 106, 112, and 114 to close. Control signal P2C is now at a logic ONE level and P2D is at a logic ZERO level causing switches 102, 108, 110, and 116 to open. VINP and VINM signals are applied to capacitors 128, 130 and 132, 134 respectively. During P1D pulse 152, the differential input voltage to the comparator is sampled and presented to the input of differential gain stage 136. The voltage signal VGSIN appearing at the input of gain stage 136, during pulse 152, is calculated as shown in equation (1) as follows, $$VGSIN = VIN - \frac{VREFP - VREFM}{1+d} \quad (1)$$

where VIN is the differential voltage appearing at the inputs of switched capacitor circuit 100, and 1+d is a constant, where the value of d is given in equation (2) as, $$d = \frac{\text{value of capacitor 130}}{\text{value of capacitor 128}} \quad (2)$$

In FIG. 1, capacitor 128 is selected to be equal in value to capacitor 134. Likewise, capacitor 130 is selected to be equal in value to capacitor 132. For the present example, the values for capacitors 128 and 134 are each 0.5072 picofarads and capacitors 130 and 132 are each 1.0039 picofarads. Differential gain stage 136 provides an amplified signal at nodes 142 and 144 that is representative of the VGSIN input signal.

By now it can be appreciated that switched capacitor circuit 100 subtracts a reference voltage from an input signal voltage and compares the resultant difference signal voltage for determining the relative magnitude of the difference signal voltage. As an advantage of the present invention, switched capacitor circuit 100 is implemented with a minimal number of components and uses reference voltages for comparison that are derived from internal voltages.

After the completion of pulse 152 and prior to the transition to a logic ONE of P2D pulse 156, time period 154 allows output stage 138 to process the signal appearing at nodes 142 and 144 to provide an output signal at nodes 146 and 148. The signal appearing at nodes 146 and 148 latches into the S and R inputs, respectively, of SR latch 140. The signal remains latched until the next comparison process is initiated in comparator circuit 72 when P1C transitions to a logic ZERO and a correspondingly P1D transitions to a logic ONE.

In an alternate embodiment of the present invention, an intermediate gain stage (not shown) is inserted between differential gain stage 136 and output stage 138. The intermediate gain stage provides additional amplification of the signal presented to the input of differential gain stage 136. The requirement for use of an intermediate gain stage is dependent upon the amplitude of the signal to be processed by comparator circuit 72.

Figure 3:
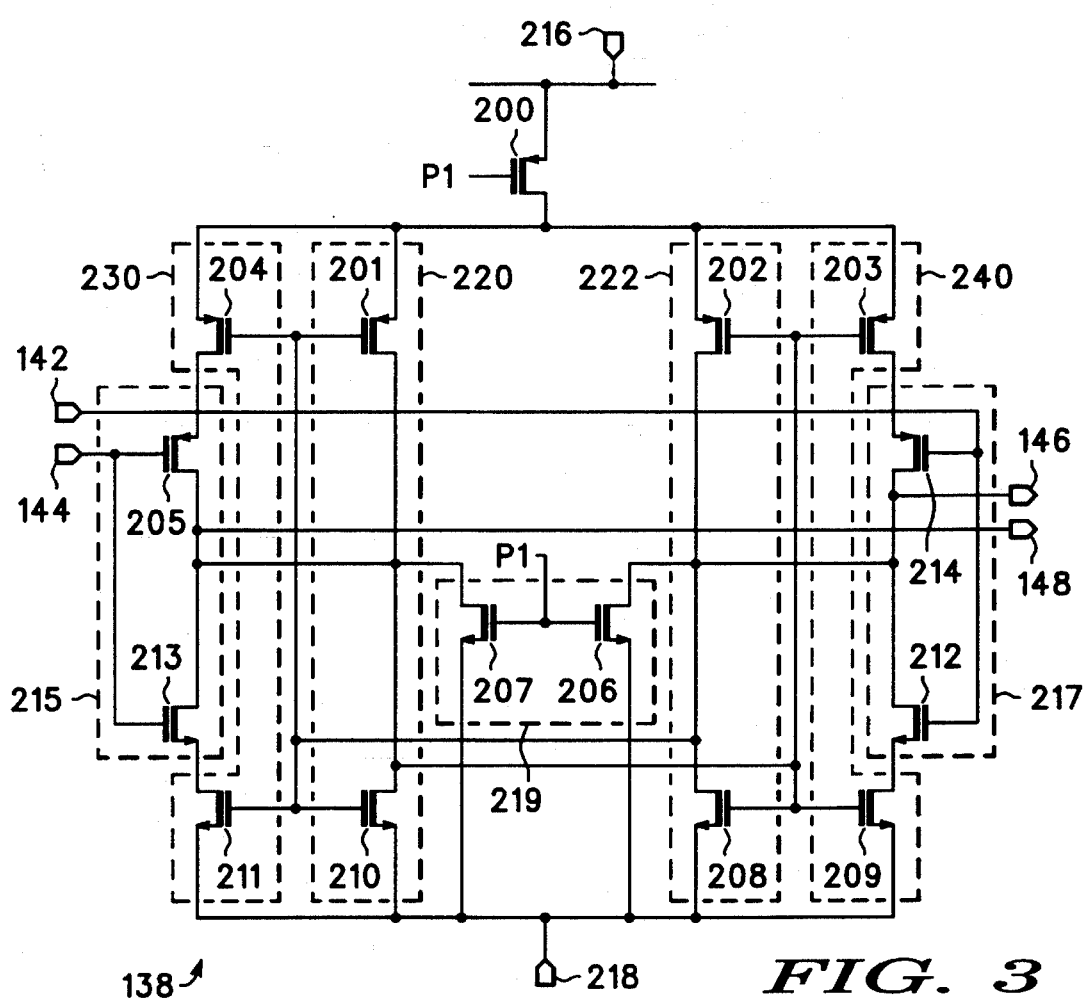
FIG. 3 is a schematic diagram of a zero static current output stage of the high speed latching comparator of FIG. 1.

Referring now to FIG. 3, output stage 138 is coupled for receiving a differential signal at input nodes 142 and 144. Output stage 138 operates between power supply conductor VDD at node 216 and power supply conductor VSS at node 218. For the present example, VDD is 2.70 volts and VSS is at ground potential. The back gates of p-channel transistors 200, 201, 202, 203, 204, 205, and 214 are coupled to power supply conductor VDD. Output stage 138 provides an amplified output, at nodes 146 and 148, of the signal produced by differential gain stage 136.

Output stage 138 operates as follows. During the time period that control signal P1 is a logic ONE, the differential voltage appearing at the input to comparator circuit 72 is sampled by switched capacitor circuit 100 and compared to the difference of VREFP and VREFM, divided by a constant. The resultant voltage is amplified by differential gain stage circuit 136. The amplified signal is presented to input nodes 142 and 144 of output stage 138. In output stage 138 of FIG. 3, control signal P1 is coupled to the gate of p-channel transistor 200. During the time period when P1 is a logic ONE, transistor 200 is in an off state and current flow is interrupted between power supply conductor 216 and p-channel transistors 201, 202, 203, and 204.

Thus as an advantage of the present invention, output stage 138 does not consume power when P1 is a logic ONE. As another advantage of the present invention, during the non-conducting operation of output stage 138, buffer circuit 215, including transistors 205 and 213, and buffer circuit 217, including transistors 212 and 214, serve to prevent the changing voltage appearing at input nodes 142 and 144 from being transmitted to output nodes 146 and 148. Hence, buffer circuits 215 and 217 isolate output nodes 146 and 148 from input nodes 142 and 144, respectively. During dynamic operation, buffer circuit 215 provides a buffer output signal that is an amplified representation of the input signal appearing at node 144. Similarly, during dynamic operation, buffer circuit 217 provides a buffer output signal that is an amplified representation of the input signal appearing at node 142.

Output stage 138 is initialized by shorting output node 148 to output node 146. Control signal P1 is coupled to initialization circuit 219 at the gates of n-channel transistors 206 and 207. When P1 is a logic ONE, transistors 206 and 207 are in an ON state, causing outputs 146 and 148 to be at the same voltage level which, for the present example, is ground. Since outputs 146 and 148 are at the same voltage level, when power is applied to output stage 138, outputs 146 and 148 immediately diverge in response to the voltage differential appearing at input nodes 142 and 144. In another embodiment of the present invention, output stage 138 is initialized by forcing output node 148 and output node 146 to a predetermined voltage. By initiating output nodes 148 and 146 at a predetermined voltage, the speed of output stage 138 is enhanced at the expense of additional current drain.

Looking at further detail of the operation of output stage 138, the application of a logic ONE control signal P1 at the gates of transistors 206 and 207, forces the voltages at nodes 146 and 148 to be equal and at ground potential. As a result the differential drain currents of transistors 204, 211, 203, 209 are forced to be equal. Now, for example, if voltage V+ΔV is applied to node 144, and voltage V−ΔV is applied to node 142, equations (3) through (6) describe the change in drain currents of transistors 204, 211, 203, 209 during regeneration within output stage 138, $$\Delta i_{D204} = -\frac{\Delta V}{r_{ds204}} \quad (3)$$

$$\Delta i_{D211} = +\frac{\Delta V}{r_{ds211}} \quad (4)$$

$$\Delta i_{D203} = +\frac{\Delta V}{r_{ds203}} \quad (5)$$

$$\Delta i_{D209} = -\frac{\Delta V}{r_{ds209}}, \quad (6)$$

where rds is the drain source resistance of the respective transistor.

The change in current flow into node 148 is given by equation (7), $$\Delta i_{D204} - \Delta i_{D211} = \frac{\Delta V}{r_{ds204}} - \left( +\frac{\Delta V}{r_{ds211}} \right) \quad (7)$$

and assuming that rds204 is equal to rds211, then in equation (8), $$\Delta i_{D204} - \Delta i_{D211} = \frac{2\Delta V}{r_{ds}}. \quad (8)$$

Similarly, for the change in current flowing into node 146 is given by equation (9), $$\Delta i_{D203} - \Delta i_{D209} = +\frac{2\Delta V}{r_{ds}}. \quad (9)$$

Since the net current flowing into a node must be equal to zero, the voltage appearing at node 148 changes in a negative direction due to the effect of the current described in equation (8). Likewise the voltage appearing at node 146 changes in a positive direction due to the effect of the current described in equation (9). The increase in voltage at node 146, and at the gates of transistor 211 and transistor 204, causes an increase in the drain current of transistor 211 and a decrease of drain current in transistor 204. Transistors 204 and 211 operate as feedback circuit 230. The gates of transistors 204 and 211 form the input of feedback circuit 230 and receive the increasing voltage signal from node 146. The drains of transistors 204 and 211 form the respective outputs of feedback circuit 230, which drive node 148, with a feedback signal, in a decreasing manner to a lower voltage level. As the voltage level at node 148 is driven lower by feedback circuit 230, the decreasing voltage at node 148 is fed back to the gates of transistor 203 and transistor 209, causing an increase in the drain current of transistor 203 and a decrease in the drain current of transistor 209, and further forcing the voltage at node 146 to continue to rise. Transistors 203 and 209 operate as feedback circuit 240. The gates of transistors 203 and 209 form the input of feedback circuit 240, and receive the decreasing voltage signal from node 148. The drains of transistors 203 and 209 form the respective outputs of feedback circuit 240, which drive node 146, with a feedback signal, in an increasing manner to a higher voltage level. As the voltage level at node 148 is driven lower by feedback circuit 240, a regenerative process is created. As the voltage at node 148 decreases and continues to fall in a regenerative fashion, the voltage at node 146 continues to increase, and continues to rise, likewise in a regenerative fashion.

In the regeneration process of comparator output stage 138, the increase in the voltage at node 146 is a result of positive feedback of the voltage at node 146 applied to the gates of transistors 204 and 211, causing a corresponding fall in the voltage at node 148, causing, in turn, a decrease in the voltage applied to the gates of transistors 203 and 209, thus, regeneratively driving the voltage at node 146 in an increasing direction. The continuing regenerative decrease in the voltage at node 148 is a result of positive feedback of the voltage at node 148 applied to the gates of transistors 203 and 209, causing a corresponding rise in the voltage at node 146, causing, in turn, an increase in the voltage applied to the gates of transistors 204 and 211, thus, further driving the voltage at node 148 in a decreasing direction.

The regenerative action continues in output stage 138 until the voltage at node 146 reaches the positive voltage supply rail and the voltage at node 148 reaches the negative voltage supply rail. When the regenerative action ceases, the signal voltage at nodes 142 and 144 of output stage 138 appears as an amplified signal that is latched at output nodes 146 and 148. Node 148 is latched at the negative voltage supply rail, node 146 is latched at the positive voltage supply rail, and static current flow is zero in output stage 138.

Output stage 138 can be re-initialized upon the application of a logic ONE control signal P1 at the gates of transistors 206 and 207 forcing the voltages at nodes 146 and 148 again to be equal. As a result the drain currents of transistors 204, 211, 203, 209 are forced to be equal. Now, for example, if voltage V−ΔV is applied to node 144, and voltage V+ΔV is applied to node 142, the regenerative action proceeds as follows.

The net current into node 148 causes the voltage to change in a positive direction. Likewise the voltage appearing at node 146 changes in a negative direction due to the effect of the net current into node 146. The increase in voltage at node 148, and at the gates of transistor 209 and transistor 203, causes an increase in the drain current of transistor 209 and a decrease of drain current in transistor 203. Transistors 203 and 209 operate as feedback circuit 240. The gates of transistors 203 and 209 form the input of feedback circuit 240 and receive the increasing voltage signal from node 148. The drains of transistors 203 and 209 form the respective outputs of feedback circuit 240, which drive node 146 in a decreasing manner to a lower voltage level. As the voltage level at node 146 is driven lower by feedback circuit 240, the decreasing voltage at node 146 is fed back to the gates of transistor 204 and transistor 211, causing an increase in the drain current of transistor 204 and a decrease in the drain current of transistor 211, and further forcing the voltage at node 148 to continue to rise. Transistors 204 and 211 operate as feedback circuit 230. The gates of transistors 204 and 211 form the input of feedback circuit 230, and receive the decreasing voltage signal from node 146. The drains of transistors 204 and 211 form the respective outputs of feedback circuit 230, which drive node 148 in an increasing manner to a higher voltage level. As the voltage level at node 146 is driven lower by feedback circuit 230, a regenerative process is created. As the voltage at node 146 decreases and continues to fall in a regenerative fashion, the voltage at node 148 continues to increase, and continues to rise, likewise in a regenerative fashion.

In the regeneration process of comparator output stage 138, the increase in the voltage at node 148 is a result of positive feedback of the voltage at node 148 applied to the gates of transistors 203 and 209, causing a corresponding fall in the voltage at node 146, causing, in turn, a decrease in the voltage applied to the gates of transistors 204 and 211, thus, regeneratively driving the voltage at node 148 in an increasing direction. The continuing regenerative decrease in the voltage at node 146 is a result of positive feedback of the voltage at node 146 applied to the gates of transistors 204 and 211, causing a corresponding rise in the voltage at node 148, causing, in turn, an increase in the voltage applied to the gates of transistors 203 and 209, thus, further driving the voltage at node 146 in a decreasing direction.

The regenerative action continues in output stage 138 until the voltage at node 148 reaches the positive voltage supply rail and the voltage at node 146 reaches the negative voltage supply rail. When the regenerative action ceases, the signal voltage at nodes 142 and 144 of output stage 138 appears as an amplified signal that is latches at output nodes 146 and 148. Node 148 is latched at the positive supply rail voltage and node 146 is latched at the negative supply rail voltage.

As an advantage of the present invention, the sensitivity of the amplification of output stage 138 is enhanced through the implementation of regenerative feedback paths that provide large amounts of gain for extremely small input signals. As a further advantage of the present invention, once an input signal is detected at the inputs of output stage 138 and latched at output nodes 146 and 148, zero current flows through output stage 138. Hence, output stage 138 consumes power only when operating in a dynamic mode.

In another embodiment of the present invention, the speed by which an input signal is latched at the outputs of output stage 138 is enhanced by providing additional gain from node 146 to node 148 and from node 148 to node 146. Referring again to FIG. 3, gain element 220 and gain element 222 are shown. Gain element 220 is configured as a CMOS inverter with the gates of transistors 201 and 210 coupled to output node 146 to provide added feedback gain to buffer output node 146. The drains of transistors 201 and 210 are coupled to output node 148. Gain element 220 has a gain of less than minus one and is configured as to add gain to buffer output node 148. Gain element 222 is configured as a CMOS inverter with the gates of transistors 202 and 208 coupled to output node 148 to provide added feedback gain to output node 148. The drains of transistors 202 and 208 are coupled to output node 146. Gain element 222 has a gain of less than minus one and is configured as to add gain to node 146.

Gain element 220 is configured with the source and gate of transistor 201 coupled respectively to the source and gate of transistor 204. Likewise, the source and gate of transistor 210 are coupled respectively to the source and gate of transistor 211. Gain element 220 consumes power only when output stage 138 is operating in a dynamic mode.

Gain element 222 is configured with the source and gate of transistor 202 coupled respectively to the source and gate of transistor 203. Likewise, the source and gate of transistor 208 are coupled respectively to the source and gate of transistor 209. Gain element 222 consumes power only when output stage 138 is operating in a dynamic mode. Thus, as another advantage of the present invention, the speed of output stage 138 can be enhanced through the addition of zero static current drain gain elements.

By now it can be appreciated that the comparator of the present invention provides a minimal component circuit for comparing an input signal to a reference signal. The comparator subtracts the input signal from the reference signal and amplifies the difference. The comparator uses a regenerative circuit in a high speed latching output stage to transfer the compared signal to a latch circuit. The output stage consumes power only when processing the compared signal. The output stage also buffers the compared signal from a new incoming signal to maintain the integrity of the compared signal for further processing at the latch circuit output.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A comparator circuit, comprising:
   a first charge storage element having a first terminal coupled for receiving a first reference signal in response a first control signal and further coupled for receiving a first input signal at said first terminal in response to a second control signal;
   a second charge storage element having a first terminal coupled for receiving a second reference signal in response said first control signal and further coupled for receiving said first input signal at said first terminal in response to said second control signal; and
   compare means having a first input coupled to common second terminals of said first and second charge storage elements for receiving a first compare signal, a second input coupled for receiving a second compare signal, and an output for providing an output signal having a first state when said first compare signal is greater than said second compare signal and having a second state when said first compare signal is less than said second compare signal.

2. The comparator circuit of claim 1 wherein said first charge storage element includes a first capacitor having first and second terminals coupled to said first and second terminals of said first charge storage element respectively.

3. The comparator circuit of claim 2 wherein said second charge storage element includes a second capacitor having first and second terminals coupled to said first and second terminals of said second charge storage element respectively.

4. The comparator circuit of claims 3 further including:
   a first switch having a first conduction terminal coupled for receiving said first reference signal, a second conduction terminal coupled to said first terminal of said first capacitor, and a control terminal coupled for receiving said first control signal,
   a second switch having a first conduction terminal coupled for receiving said first input signal, a second conduction terminal coupled to said first terminal of said first capacitor, and a control terminal coupled for receiving said second control signal;
   a third switch having a first conduction terminal coupled for receiving said first input signal, a second conduction terminal coupled to said first terminal of said second capacitor, and a control terminal coupled for receiving said second control signal; and
   a fourth switch having a first conduction terminal coupled for receiving said second reference signal, a second conduction terminal coupled to said first terminal of said second capacitor, and a control terminal coupled for receiving said first control signal.

5. The comparator circuit of claim 4 further including:
   a third charge storage element having a first terminal coupled for receiving a third reference signal in response said first control signal and further coupled for receiving a second input signal at said first terminal in response to said second control signal; and a fourth charge storage element having a first terminal coupled for receiving said second reference signal in response said first control signal and further coupled for receiving said second input signal at said first terminal in response to said second control signal; wherein second terminals of said third and fourth charge storage elements form said second compare signal.

6. The comparator circuit of claim 5 wherein said third charge storage element includes a third capacitor having first and second terminals coupled to said first and second terminals of said third charge storage element respectively.

7. The comparator circuit of claim 6 wherein said fourth charge storage element includes a fourth capacitor having first and second terminals coupled to said first and second terminals of said fourth charge storage element respectively.

8. The comparator circuit of claim 7 further including:

a fifth switch having a first conduction terminal coupled for receiving said third reference signal, a second conduction terminal coupled to said first terminal of said third capacitor, and a control terminal coupled for receiving said first control signal;

a sixth switch having a first conduction terminal coupled for receiving said second input signal, a second conduction terminal coupled to said first terminal of said third capacitor, and a control terminal coupled for receiving said second control signal;

a seventh switch having a first conduction terminal coupled for receiving said second input signal, a second conduction terminal coupled to said first terminal of said fourth capacitor, and a control terminal coupled for receiving said second control signal; and an eighth switch having a first conduction terminal coupled for receiving said second reference signal, a second conduction terminal coupled to said first terminal of said fourth capacitor, and a control terminal coupled for receiving said first control signal.

9. The comparator circuit of claim 8 wherein said compare means includes:

a differential gain stage having a first input coupled to said second terminals of said first and second capacitors and having a second input coupled to said second terminals of said third and fourth capacitors;

a comparator output stage having first and second inputs coupled to first and second outputs of said differential gain stage; and a latch having a set input coupled to a first output of said comparator output stage, a reset input coupled to a second output of said comparator output stage, and an output for latching said output signal of said compare means.

10. A method for comparing first and second input signals, comprising the steps of:

applying a first reference signal to a first terminal of a first charge storage element;

applying a second reference signal to a first terminal of a second charge storage element where said first and second charge storage elements have common second terminals to a first input of a comparator circuit such that a difference between said first and second reference signals is stored across said first and second charge storage elements;

applying a third reference signal to a first terminal of a third charge storage element;

applying said second reference signal to a first terminal of a fourth charge storage element where said third and fourth charge storage elements have common second terminals to a second input of said comparator circuit such that a difference between said second and third reference signals is stored across third and fourth charge storage elements;

removing said first and second and third reference signals;

applying the first input signal to said first terminals of said first and second charge storage elements;

applying the second input signal to said first terminals of said third and fourth charge storage elements so that an output signal of said comparator circuit has a first state when the first input signal is greater than the second input signal and a second state when the first input signal is less than the second input signal.

11. The method of claim 10 further including the steps of:

amplifying signals presented to said first and second inputs of said comparator circuit for providing an amplified comparison signal; and latching said amplified comparison signal for providing said output signal of said comparator circuit.

* * * * *